(12) United States Patent
Kiuchi et al.

(10) Patent No.: US 7,981,963 B2
(45) Date of Patent: Jul. 19, 2011

(54) INSULATION MATERIAL OF REACTIVE ELASTOMER, EPOXY RESIN, CURING AGENT AND CROSSLINKED RUBBER

(75) Inventors: Yukihiro Kiuchi, Minato-ku (JP); Masahiro Ishibashi, Minato-ku (JP); Yoshitaka Kyogoku, Minato-ku (JP); Masatoshi Iji, Minato-ku (JP)

(73) Assignee: NEC Corporation, Tokyo (JP)

( * ) Notice: Subject to any disclaimer, the term of this patent is extended or adjusted under 35 U.S.C. 154(b) by 935 days.

(21) Appl. No.: 11/733,689

(22) Filed: Apr. 10, 2007

(65) Prior Publication Data

US 2007/0251721 A1    Nov. 1, 2007

Related U.S. Application Data

(63) Continuation-in-part of application No. PCT/JP2006/312161, filed on Jun. 16, 2006.

(30) Foreign Application Priority Data

Jul. 28, 2005  (JP) ................................ 2005-218220
Jul. 26, 2006  (JP) ................................ 2006-203881

(51) Int. Cl.
*B32B 25/16* (2006.01)
*C08L 9/00* (2006.01)
*C08L 63/00* (2006.01)
*C08L 63/04* (2006.01)
*C08L 77/06* (2006.01)
*H05K 1/03* (2006.01)

(52) U.S. Cl. .......... 525/108; 714/258; 428/416; 525/65; 525/109; 525/113

(58) Field of Classification Search .................. None
See application file for complete search history.

(56) References Cited

U.S. PATENT DOCUMENTS

| 6,794,031 B2 * | 9/2004 | Murakami et al. ...... 428/355 EP |
| 2003/0166796 A1 * | 9/2003 | Imaizumi et al. ............. 525/534 |
| 2006/0079609 A1 * | 4/2006 | Nishioka et al. ............. 523/400 |

FOREIGN PATENT DOCUMENTS

| CN | 1439038 A | | 8/2003 |
| JP | 07-097771 A | | 4/1995 |
| JP | 10-294567 A | | 11/1998 |
| JP | 2000-154356 A | | 6/2000 |
| JP | 2001-081282 A | | 3/2001 |
| JP | 2001-219491 A | * | 8/2001 |
| JP | 2002-198462 A | | 7/2002 |
| JP | 2003-174247 A | | 6/2003 |
| JP | 2003-277579 A | * | 10/2003 |
| JP | 2005-036136 A | | 2/2005 |
| WO | WO 02/00791 A1 | * | 1/2002 |

OTHER PUBLICATIONS

Derwent accession No. 2002-303740 for WO 02/00791 A1, Chinese Patent No. 1,439,038 A and U.S. Publication No. 2003/0166796 A1, Imaizumi et al., Jan. 3, 2002, two pages.*
Wikipedia definition of cyanate, 2010, one page.*

* cited by examiner

*Primary Examiner* — Robert Sellers
(74) *Attorney, Agent, or Firm* — Sughrue Mion, PLLC

(57) ABSTRACT

In a semiconductor device, the topmost wiring layer of the package board is formed from an insulation material in which the elongation at break is 20% or higher and Young's modulus is 1 GPa or less when the temperature is 10 to 30° C. This insulation material contains a reactive elastomer that reacts with epoxy resin or an epoxy resin curing agent; an epoxy resin; an epoxy resin curing agent; and a crosslinked styrene-butadiene rubber having a double bond and a hydroxyl group, a carboxylic group, or another polar group. It is therefore possible to provide a semiconductor device that has a wiring board in which the connection reliability in relation to temperature cycles is high and the adhesiveness between the insulation layer and the electroless copper plating layer is also high.

8 Claims, 3 Drawing Sheets

INSULATION MATERIAL OF REACTIVE ELASTOMER, EPOXY RESIN, CURING AGENT AND CROSSLINKED RUBBER

This application claims priority from PCT Application No. PCT/JP2006/312161 filed Jun. 16, 2006, and from Japanese Patent Application Nos. 2005-218220 filed Jul. 28, 2005, 2006-203881, filed Jul. 26, 2006, which applications are incorporated herein by reference.

TECHNICAL FIELD

The present invention relates to an insulation material that forms a wiring board, to a wiring board that uses the insulation material, and to a semiconductor device provided with the wiring board.

BACKGROUND ART

A method has been developed in recent years whereby a plurality of solder balls is arrayed in the form of a matrix on the surface of a wiring board, and a semiconductor chip is mounted on the solder balls in order to obtain a smaller semiconductor device. Examples of such a semiconductor device are FCBGA (Flip Chip Ball Grid Array) and WLCSP (Wafer Level Chip Size Package). Also known is a multilayer wiring board in which a plurality of wiring-embedded resin layers is layered, a build-up wiring board with a so-called core member, and a package board includes MLTS (Multi Layer Thin Substrate) (brand name) structures.

Nevertheless, conventional methods have the problems described below. In other words, silicon, which is the material of the semiconductor chip, and the resin that forms the wiring board have mutually different coefficients of thermal expansion. For this reason, warping is generated in the semiconductor device, and force is applied to the solder balls because the shrinkage of the semiconductor chip and the shrinkage of the wiring board are mutually different when the semiconductor device is cooled to room temperature, even when the semiconductor chip is mounted on the wiring board so that force is not applied during mounting. Also, the solder balls may experience fatigue fracturing and become disconnected when the semiconductor device repeatedly undergoes heating and cooling cycles due to heat generated by the operation of the semiconductor chip and changes in the outside temperature.

Conventionally, attempts have been made to avoid this problem and improve the connection reliability of a semiconductor device by forming the wiring board from a resin that is as rigid as possible. This is intended to minimize warping of the semiconductor device and deformations of the wiring board by increasing the rigidity of the wiring board. In Patent Document 1, for example, a method is disclosed that uses an insulation material that has a modulus of elasticity of 10 GPa or higher as the material of the wiring board.

[Patent Document 1] Japanese Laid-Open Patent Application No. 2002-198462

DISCLOSURE OF THE INVENTION

The Problem to be Solved by the Invention

However, the above-described prior art has the problems described below. In other words, the connection reliability of a semiconductor device in relation to temperature cycles is still insufficient even when the wiring board is formed from a material that has a modulus of elasticity of 10 GPa or higher, as described in Patent Document 1. There is a problem in that the base material, which is the main component of the insulation material that forms the wiring board as described in Patent Document 1, generally has low adhesiveness with the copper wiring when electroless copper plating is carried out on the surface to form the copper wiring. In view of this fact, an adhesive for improving the adhesiveness between the base material and the copper wiring is ordinarily added to the base material. However, depending on the type of base material, such adhesives have variable effect, and the effect of improving the plating adhesiveness cannot be obtained using conventional additives in combination with some base materials.

The present invention was contrived in view of the foregoing, and an object is to provide a wiring board that has high connection reliability in relation to temperature and has good adhesiveness between the insulation layer and the electroless copper plating, to provide an insulation material that forms the wiring board, and to provide a semiconductor device provided with the wiring board.

Means for Solving the Problem

The insulation material of the present invention comprises a reactive elastomer that reacts with epoxy resin or an epoxy resin curing agent; an epoxy resin; an epoxy resin curing agent; and a crosslinked rubber having a double bond and a polar group in the structure thereof, wherein Young's modulus in a temperature range of 10 to 30° C. is 1 GPa or less.

The polar group may be a hydroxyl group or a carboxyl group, and the crosslinked rubber is crosslinked styrene-butadiene rubber.

The value of (E×100)/(A+B+C+E) is preferably 3 to 25%, and is more preferably 5 to 20%, wherein A mass % is the content of the reactive elastomer, B mass % is the content of the epoxy resin, C mass % is the content of the epoxy resin curing agent, and E mass % is the content of the crosslinked rubber.

The reactive elastomer is preferably a polyamide elastomer that does not contain a cyanate group in the structure of the elastomer, or is a flexible epoxy resin that contains an unsaturated double bond and an epoxy group in the structure of the elastomer.

The value of (A×100)/(A+B+C+E) is preferably 15 to 80 mass %, and more preferably to 50 to 75 mass %.

The value of (B×100)/(A+B+C+E) is preferably 20% or less. The elongation at break is thereby improved.

The wiring board of the present invention uses the above-described insulation material.

In the present invention, the wiring board can follow the thermal expansion of external elements when the wiring board becomes heated or cooled after semiconductor chips or other external elements have been mounted to form a semiconductor device on the wiring board, by forming the wiring board from an insulation material that has a relatively low Young's modulus of 1 GPa or less in a temperature range of 10 to 30° C. Warping of the semiconductor device can thereby be reduced, and the force applied to the connection portion between the wiring board and the external elements can be reduced. Accordingly, the connection reliability in relation to temperature cycles of the semiconductor device can be improved. The adhesiveness between the insulation layer and the copper plating layer can be improved when copper plating is formed by electroless plating on an insulation layer composed of the insulation material because the insulation material contains a crosslinked rubber having a double bond and a polar group in the structure of the insulation material.

The semiconductor device of the present invention is provided with the above-described wiring board.

Effect of the Invention

In accordance with the present invention, the wiring board can follow the thermal expansion of external elements when external elements are mounted on the wiring board, by forming the wiring board from an insulation material that has a Young's modulus of 1 GPa or less in a temperature range of 10 to 30° C. Therefore, warping of the wiring board can be reduced, fracturing of the connection portion can be prevented, and connection reliability in relation to temperature cycles can be improved. The adhesiveness between the electroless copper plating layer and the insulation layer composed of the insulation material can be improved because the insulation material contains a crosslinked rubber having a double bond and a polar group in the structure of the insulation material.

KEY

Figure 1:
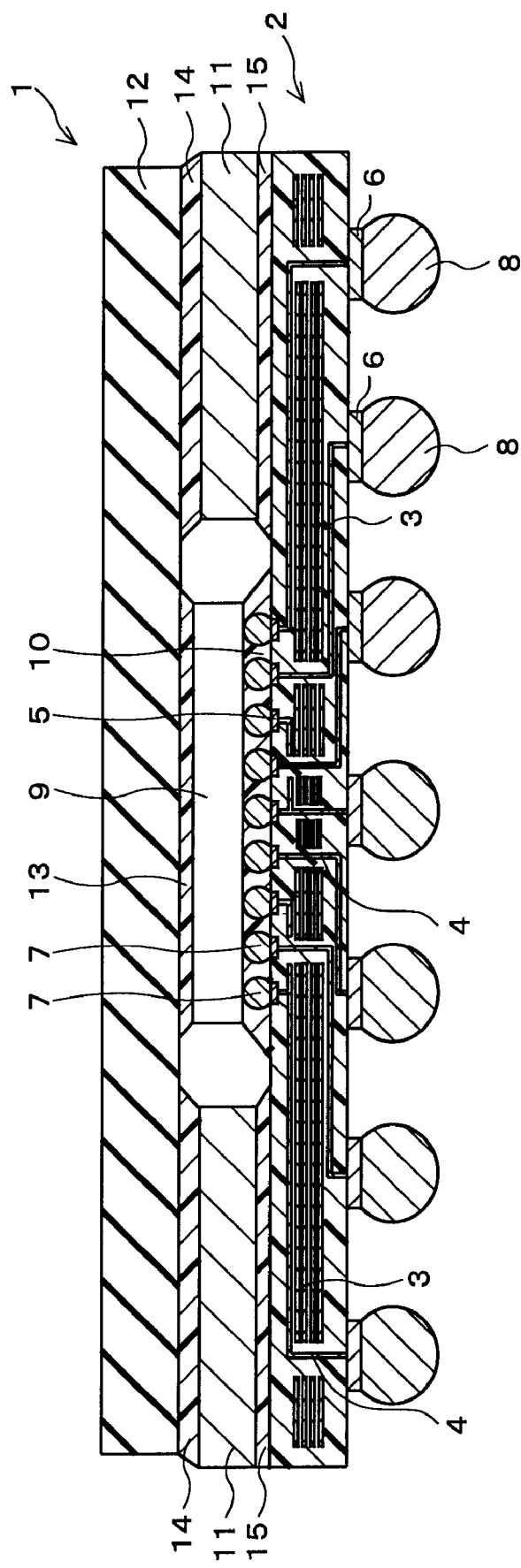
FIG. 1 is a cross-sectional view showing the semiconductor device of the embodiments of the present invention.

1: Semiconductor device
2: Package board
3: Wiring
4: Via
5: Mounting pad
6: Ball pad
7: Solder bump
8: BGA ball
9: Semiconductor chip
10: Underfill resin
11: Stiffener
12: Lid
13, 14, 15: Adhesive layers
16: Wiring layers
41: Pectinate wiring
42: Electrode
43: Evaluation board
44: FR-4 board
45: Wiring
46: Via
47, 49, 51: Cu patterns
48: Build-up resin layer
50: Solder resist

BEST MODE FOR CARRYING OUT THE INVENTION

Figure 2:
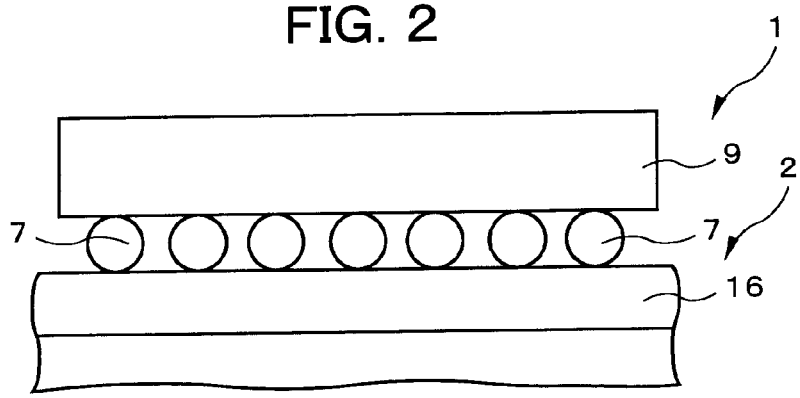
FIG. 2 is a schematic view showing the characteristics of the semiconductor device.

Embodiments of the present invention are described in detail below with reference to the attached diagrams. FIG. 1 is a cross-sectional view showing the semiconductor device of the embodiments of the present invention, and FIG. 2 is a schematic view showing the characteristics of the semiconductor device. The semiconductor device 1 according to the present embodiment is an FCBGA semiconductor device, as shown in FIG. 1. A package board 2 is disposed in the semiconductor device 1. The package board 2 formed by layering a plurality of wiring layers, and wiring 3 composed of, e.g., copper, and vias 4 connected to the wiring 3 are formed in the wiring layers. A plurality of mounting pads 5 is formed on a wiring layer 16 (see FIG. 2), which is the topmost layer of the package board 2. The wiring 3, vias 4, and mounting pads 5 may also be generically referred to as "wiring." A plurality of ball pads 6 is formed on the lower surface of the package board 2. The mounting pads 5 and ball pads 6 are each arrayed in the form of a matrix as viewed from directly above (hereinafter referred to as "plan view") on the upper surface of the package board 2.

In a plan view, the ball pads 6 are larger than the mounting pads 5, and the array pitch of the ball pads 6 is greater than the array pitch of the mounting pads 5. The mounting pads 5 are connected to the ball pads 6 by way of the wiring 3 and vias 4. Solder bumps 7 are connected to the mounting pads 5, and BGA balls 8 are connected to the ball pads 6. The BGA balls 8 are larger than the solder bumps 7.

A semiconductor chip 9 is mounted on the package board 2. The semiconductor chip 9 is composed of, e.g., multilayered wiring layers (not shown) disposed on a silicon substrate (not shown), and an integrated circuit is formed on the surface of the silicon substrate and the multilayered wiring layer. The surface of the multilayered wiring layer in the semiconductor chip 9 has I/O pads (not shown) disposed on the surface of the side that faces the package board 2, and the I/O pads are connected to the solder bumps 7. The I/O pads of the semiconductor chip 9 are thereby connected to the mounting pads 5 by way of the solder bumps 7, and are connected to the BGA balls 8 by way of the wiring 3, vias 4, and ball pads 6. An underfill resin 10 is filled about the periphery of the solder bumps 7 between the package board 2 and semiconductor chip 9. The semiconductor chip 9 is thereby connected and fixed to the package board 2.

A stiffener 11 composed of stainless steel or copper is disposed in the area surrounding the semiconductor chip 9 on the package board 2. The stiffener 11 is bonded to the package board 2 using an adhesive layer 15. The stiffener 11 is frame-shaped in a plan view, and the semiconductor chip 9 is accommodated in the open area of the frame shape. The upper surface of the stiffener 11 is substantially in the same plane as the semiconductor chip 9.

A lid 12 composed of, e.g., ceramic is disposed on the semiconductor chip 9 and stiffener 11. The lid 12 is bonded to the semiconductor chip 9 using an adhesive layer 13 and to the stiffener 11 using an adhesive layer 14. The shape of the lid 12 is a shape that substantially overlaps the package board 2 in a plan view. The lid 12 functions as a heat sink for the semiconductor chip 9. The semiconductor device 1 is mounted on a motherboard (not shown) or the like by way of BGA balls 8.

The wiring layer 16 disposed on the topmost wiring layer of the package board 2, i.e., on the surface that faces the semiconductor chip 9 and on which the mounting pads 5 are formed (see FIG. 2), is formed from an insulation material that has a Young's modulus of 1 GPa or less when the temperature is between 10 and 30° C. (hereinafter referred to as "room temperature") and that has an elongation at break of 20% or higher. This insulation material contains a reactive elastomer (A) that can react with epoxy resin or an epoxy resin curing agent; an epoxy resin (B); an epoxy resin curing agent (C); and a crosslinked rubber as an additive (E) having a double bond and a polar group in the structure of the material.

The ratio of crosslinked rubber in the resin component, i.e., the value of (E×100)/(A+B+C+E), is 3 to 25 mass %, and may be, e.g., 5 to 20 mass %, wherein A mass % is the content of the reactive elastomer, B mass % is the content of the epoxy resin, C mass % is the content of the epoxy resin curing agent, and E mass % is the content of the crosslinked rubber. The ratio of the reactive elastomer (A) in the resin component, i.e., the value of (A×100)/(A+B+C+E), is 15 to 80 mass %, and is preferably 50 to 75 mass %. In the case, the ratio of the reactive elastomer (A), i.e., the value of (A×100)/(A+B+C+E) is 50 to 75 mass %, an insulation material of high elongation and low elasticity can be obtained. The ratio of the epoxy resin (B) in the resin component, i.e., the value of (B×100)/(A+B+C+E), is 20% or less. The reasons for the above-described numerical limits are described below.

Value of (E×100)/(A+B+C+E): 3 to 25 mass %

When the ratio of crosslinked rubber in the resin component of the insulation material, i.e., the value of (E×100)/(A+B+C+E), is less than 3%, the bonding characteristics of the electroless copper plating are sometimes insufficient. When the value exceeds 25%, the elongation of the insulation material may be reduced, or the physical properties of the insulation material may be otherwise insufficient. Therefore, the value of (E×100)/(A+B+C+E) is preferably 3 to 25%, and more preferably 5 to 20%.

Value of (A×100)/(A+B+C+E): 15 to 80 mass %

When the ratio of the reactive elastomer (A) in the resin component of the insulation material, i.e., the value of (A×100)/(A+B+C+E), is less than 15%, the reactive elastomer that assures the toughness of the insulation material is insufficient, and sufficient elongation at break cannot be obtained. If the value exceeds 80%, the curability of the insulation material becomes insufficient, and chemical resistance of the insulation material may be reduced and also electroless plating property may be degraded. Also, if the value exceeds 80%, the semi-hardened insulation material of the present embodiment can not be melted with sufficient fluidization. Therefore, the insulation material can not be added to the rough surface of the copper foil with the sufficient adhesiveness and the reliability of the connection may be degraded. Therefore, the value of (A×100)/(A+B+C+E) is preferably 15 to 80 mass %.

Value of (B×100)/(A+B+C+E): 20 mass % or less

When the ratio of the epoxy resin (B) in the resin component, i.e., the value of (B×100)/(A+B+C+E) exceeds 20 mass %, elongation at break may be insufficient. Therefore, the value of (B×100)/(A+B+C+E) is preferably 20 mass % or less.

The crosslinked rubber (E) having a double bond and a polar group described above is a crosslinked styrene-butadiene rubber having a carboxylic group or a hydroxyl group as a polar group, and en example is XSK-500 (registered trade name) manufactured by JSR. In this case, the double bond is contained in the butadiene moiety.

The reactive elastomer (A) is preferably a polyamide elastomer that does not contain a cyanate group in the structure of the elastomer. The reactive elastomer (A) is a polyamide-polybutadiene copolymer that contains a phenolic hydroxyl group. The phenolic hydroxyl group-containing polyamide-polybutadiene copolymer (hereinafter also referred to simply as "copolymer") is obtained by reacting a phenolic hydroxyl group-containing dicarboxylic acid expressed by chemical formula 1 described below, a dicarboxylic acid that does not contain a phenolic hydroxyl group expressed by chemical formula 2 described below, a diamine expressed by the chemical formula 3 described below, and a polybutadiene that has a carboxylic group at the two ends expressed by the chemical formula 4 described below or a poly butadiene that has an amino group at the two ends expressed by the chemical formula 5 described below. The phenolic hydroxyl group-containing polyamide-polybutadiene copolymer is expressed by the general chemical formulas 6 or 7 described below.

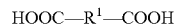  [Chemical Formula 1]

The term $R^1$ in chemical formulas 1, 6, and 7 is a bivalent aromatic compound with a carbon number of 6 to 12 having a phenolic hydroxyl group. Examples of the dicarboxylic acid having phenolic hydroxyl group expressed in the above-noted chemical formula 1 include 5-hydroxyisophthalic acid, 4-hydroxyisophthalic acid, 2-hydroxyphthalic acid, 3-hydroxyphthalic acid, and 2-hydroxyterephthalic acid.

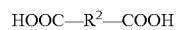  [Chemical formula 2]

The term $R^2$ in chemical formulas 2, 6, and 7 is a bivalent aromatic compound having a carbon number of 6 to 12 that does not contain a phenolic hydroxyl group or a bivalent aliphatic compound having a carbon number of 1 to 10. Examples of a dicarboxylic acid that does not contain a phenolic hydroxyl group expressed the above-noted chemical formula 2 include phthalic acid, isophthalic acid, terephthalic acid, dicarboxylic naphthalene, succinic acid, fumaric acid, glutaric acid, adipic acid, 1,3-cyclohexanedicarboxylic acid, 4,4'-diphenyl dicarboxylic acid, and 3,3'-methylenedibenzoic acid.

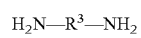  [Chemical formula 3]

The term $R^3$ in chemical formulas 3, 6, and 7 is a bivalent aromatic compound having a carbon number of 6 to 12 or a bivalent aliphatic compound having a carbon number of 1 to 10. Examples of diamines that contain a phenolic hydroxyl group among the diamines expressed by chemical formula 3 noted above include 3,3'-diamine-4,4'-dihydroxyphenylmethane, 2,2'-bis(3-amino-4-hydroxyphenyl)hexafluoropropane, 2,2'-bis(3-amino-4-hydroxyphenyl)difluoromethane, 3,4'-diamino-1,5'-benzendiol, 3,3'-dihydroxy-4,4'-diaminobisphenol, 3,3'-diamino-4,4'-dihydroxybisphenol, 2,2'-bis(3-amino-4-hydroxyphenyl)ketone, 2,2'-bis(3-amino-4-hydroxyphenyl)sulfide, 2,2'-bis(3-amino-4-hydroxyphenyl)ether, 2,2'-bis(3-amino-4-hydroxyphenyl)sulfone, 2,2'-bis(3-amino-4-hydroxyphenyl)propane, 2,2'-bis(3-amino-4-aminophenyl)propane, and 2,2'-bis(3-amino-4-aminophenyl)methane; and diamines that do not have a phenolic hydroxyl group include 3,3'-diaminodiphenyl ether, 3,4'-diaminodiphenyl ether, 4,4'-diaminodiphenyl ether, diamino naphthalene, piperazine, hexamethylenediamine, tetramethylenediamine, m-xylenediamine, 4,4'-diaminodiphenyl methane, 4,4'-diaminobenzophenone, 2,2'-bis(4-aminophenyl)propane, 3,3'-diaminodiphenyl sulfone, and 3,3'-diaminodiphenyl. The diamine is not limited, but particularly preferred is 3,4'-diaminodiphenyl ether.

[Chemical formula 4]

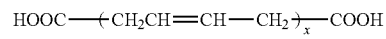

[Chemical formula 5]

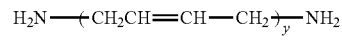

In chemical formulas 4 and 5 above, and in chemical formulas 6 and 7 below, x and y are average degrees of polymerization and are integers from 3 to 7.

[Chemical formula 6]

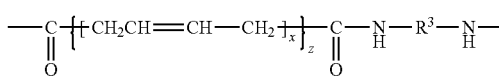
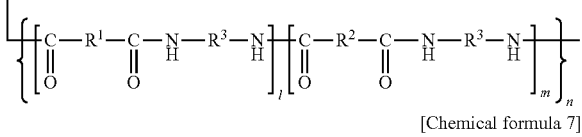

[Chemical formula 7]

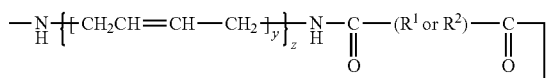
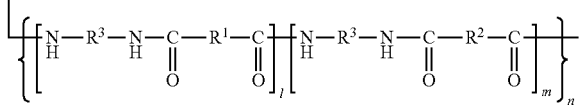

In chemical formulas 5 and 7 above, and in chemical formulas 8 and 9 below, z, l (lower case L), m, and n are average degrees of polymerization, wherein z is an integer from 5 to 15, n=l+m, n is an integer from 2 to 200, and l (lower case L) and m satisfy the relationship m/(l+m)≧0.04.

The copolymer particularly preferred among the copolymers expressed by the chemical formulas 6 and 7 is a copolymer expressed by the general chemical formulas 8 and 9 below.

molecular weight (Mw) of the copolymer is preferably 100,000 or less, and more preferably 20,000 or less.

A flexible epoxy resin that contains an unsaturated double bond and an epoxy group in the structure of the resin may be used as the reactive elastomer (A) in place of the polyamide elastomer that does not contain a cyanate group in the above-described structure.

An example of the resin (D) in which the distance between the functional groups is greater than that of the phenol novolac resin contained in the epoxy resin curing agent (C) is expressed by chemical formula 10 below.

[Chemical formula 10]

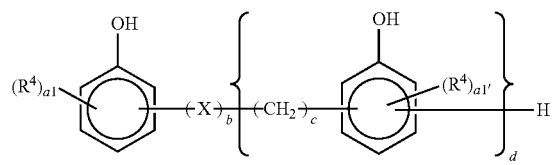

The term $R^4$ in chemical formula 10 is hydrogen or a univalent substituent group having a carbon number of 1 to 3. In the formula, a1 is an integer from 1 to 4, a1' is an integer from 1 to 3, X is the compound $X_1$ expressed by the chemical formula 12 below or is the compound $X_2$ expressed by the chemical formula 13 below, b is an integer from 1 to 10, and c and d are both 1.

[Chemical formula 8]

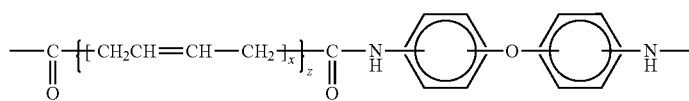
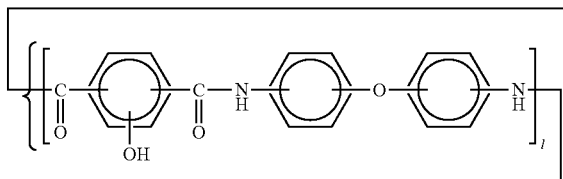
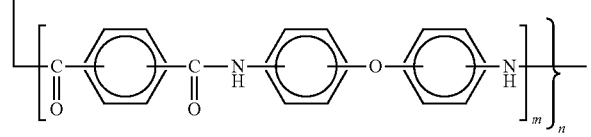

[Chemical formula 9]

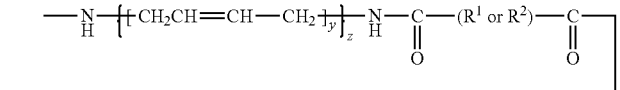
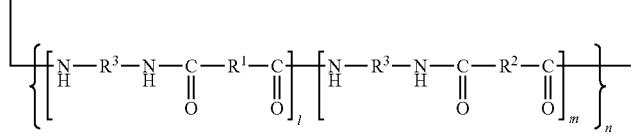

When the weight-average molecular weight (Mw) of the copolymer is 100,000 or less, sufficient fluidity can be obtained in a temperature range of 160 to 180° C. In particular, good fluidity can be obtained in a temperature range of 100 to 160° C. when the weight-average molecular weight (Mw) is 20,000 or less. Therefore, the weight-average The resin (D) in which the distance between the functional groups is greater than that of the phenol novolac resin expressed by the chemical formula 10 has a phenolic hydroxyl group as a functional group, e.g., is ethylene oxide, and an example of the resin is an ethylene oxide compound in which the distance between the phenolic hydroxyl groups in the molecular structure is greater than the distance between the phenolic hydroxyl groups in the phenol novolac resin. An example of the ethylene oxide compound is expressed by chemical formula 11 below.

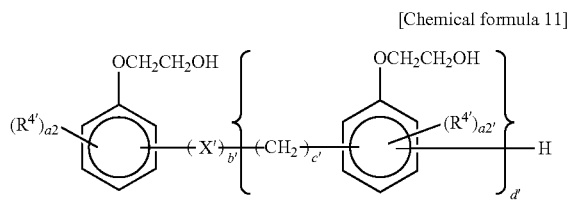

[Chemical formula 11]

The term $R^4$ in chemical formula 11 is hydrogen or a univalent substituent group having a carbon number of 1 to 3. In the formula, a2 is an integer from 1 to 4, a2' is an integer from 1 to 3, X' is the compound $X_1$ expressed by the chemical formula 12 below or is the compound $X_2$ expressed by the chemical formula 13 below, b' is an integer from 1 to 10, and c' and d' are both 1.

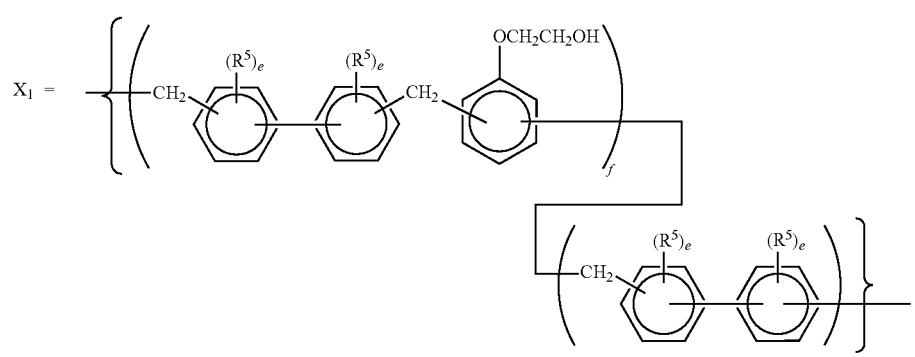

[Chemical formula 12]

The term $R^5$ in chemical formula 12 is hydrogen or a univalent substituent group having a carbon number of 1 to 3. In the formula, e is an integer from 1 to 4, and f is an integer from 0 to 9.

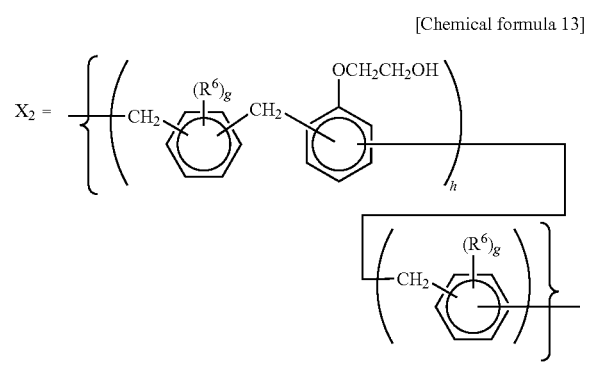

[Chemical formula 13]

The term $R^6$ in chemical formula 13 is hydrogen or a univalent substituent group having a carbon number of 1 to 3. In the formula, g is an integer from 1 to 4, and h is an integer from 0 to 9.

The resin expressed by the chemical formulas 10 and 11 above is configured such that the distance between the functional groups is greater than that of phenol novolac resin expressed by the chemical formula 14 below.

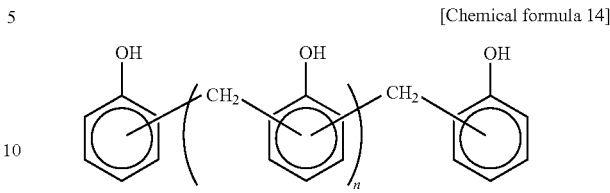

[Chemical formula 14]

In the present embodiment, the epoxy resin (B) is not particularly limited, but is preferably an epoxy resin in which the distance between the functional groups is greater than that of phenol novolac epoxy resin. The reason for this is that such an epoxy resin can efficiently form an IPN structure, and as a result, the elongation at break of the insulation material according to the present embodiment can be improved. Examples of such an epoxy resin in which the distance between the functional groups is greater than that of phenol novolac epoxy resin include phenol biphenylene aralkyl epoxy resin, phenol xylene aralkyl epoxy resin, phenol diphenyl ether aralkyl epoxy resin, bifunctional biphenyl epoxy resin, anthracene-containing novolac epoxy resin, fluorene-containing novolac epoxy resin, bisphenol fluorene-containing novolac epoxy resin, phenol biphenylene triazine epoxy resin, and phenol xylene triazine epoxy resin. Additional examples are phenoxy resins, which have an epoxy group at both ends and are bisphenol A, bisphenol F, bisphenol S, or bisphenol backbone-containing resins. The phenoxy resin has a weight-average molecular weight of about 20,000 to 100,000 in terms of polystyrene. Any of these epoxy resins may be used alone or in a plural mixture as the epoxy resin (B).

Among the epoxy resins (B) contained in the insulation material of the present embodiment, epoxy resins other than epoxy resins having a long distance between the functional groups as described above are not particularly limited. Examples include bisphenol A epoxy resin, bisphenol F epoxy resin, bisphenol S epoxy resin, naphthalene diol epoxy resin, phenol novolac epoxy resin, cresol novolac epoxy resin, bisphenol F-containing novolac epoxy resin, bisphenol A-containing novolac epoxy resin, phenol triazine epoxy resin, cresol triazine epoxy resin, tetraphenylol ethane epoxy resin, trisphenylol ethane epoxy resin, polyphenol epoxy resin, aliphatic epoxy resin, aromatic ester epoxy resin, cycloaliphatic ester epoxy resin, and ether ester epoxy resin.

It is also possible use glycidyls of diaminodiphenyl methane, diethylene triamine, diamino diphenyl sulfone, and other amine compounds. These epoxy resins may be used alone or may be used in a plural mixture.

Among the epoxy resin curing agents (C) in the insulation material of the present embodiment, components other than the resin (D) in which the distance between the functional groups is greater than that of the phenol novolac resin described above are not particularly limited. Examples of such components include bisphenol A phenolic resin, bisphenol F phenolic resin, bisphenol S phenolic resin, dihydroxy ether of a biphenyl isomer, naphthalene diol resin, phenol novolac resin, cresol novolac resin, phenol diphenyl ether aralkyl resin, naphthalene-containing novolac resin, anthracene-containing novolac resin, fluorene-containing novolac resin, bisphenol fluorene-containing novolac resin, bisphenol F-containing novolac phenolic resin, bisphenol A-containing novolac phenolic resin, phenol biphenylene triazine resin, phenol xylene triazine resin, phenol triazine resin, cresol novolac triazine resin, tetraphenylol ethane resin, trisphenylol ethane resin, polyphenol resin, aromatic ester phenolic resin, cycloaliphatic ester phenolic resin, and ether ester phenolic resin.

Other than the resins described above, diamino diphenyl ethane, diethylene triamine, diaminodiphenyl sulfone, and other amine-based compounds may be contained as components of the epoxy resin curing agent (C). Phenoxy resins that are bisphenol A, bisphenol F, bisphenol S, or bisphenol backbone-containing resins, and have a hydroxyl group at one or both ends may also be used. The phenoxy resin has a weight-average molecular weight of about, e.g., 20,000 to 100,000 in terms of polystyrene. Any of these epoxy resins may be used alone or in a plural mixture as the epoxy resin curing agent (C).

The insulation material of the present embodiment may contain an inorganic filler. When an inorganic filler is used, the mass ratio of the inorganic filler of the total weight of the reactive elastomer (A), the epoxy resin (B), the epoxy resin curing agent (C), and the inorganic filler in the present invention is preferably 50 mass % or less. When the mass ratio of the inorganic filler exceeds 50 mass %, elongation at break may be reduced, Young's modulus may be increased, and the stress reducing characteristics may be insufficient.

Known fillers can be used as the inorganic filler, and examples include fused silica, crystal silica, alumina, zircon, calcium silicate, calcium carbonate, silicon carbide, silicon nitride, boron nitride, beryllia, talcum (talc), isinglass (mica), titanium oxide, zirconia, and other powders, or beads composed of these materials formed into spherical shapes; calcium titanate, silicon carbide, silicon nitride, boron nitride, alumina, and other monocrystalline fibers; aluminum hydroxide, magnesium hydroxide, zinc borate, and other metal hydrates, the above-noted metal hydrates that have been surface treated using epoxy resin, phenolic resin, and various other organic substances; and magnesium hydroxide and various other hydroxides in which the metal has been formed into a solid solution to improve acid resistance. These fillers may be used alone, or in a combination of two or more.

The insulation material of the present embodiment may contain a curing acceleration catalyst. A catalyst that is generally used to cure epoxy resins and curing agents may be used as the curing acceleration catalyst, but this does not impose any limitation. Examples include imidazoles, diazabicycloalkenes, diazabicycloalkene derivatives, and tertiary amines. These curing acceleration catalysts may be used alone or in a combination of two or more.

Other additives may be used as required in the insulation material in the present embodiment, including silicon rubber, silicone powder, acrylonitrile-butadiene rubber (NBR), indene, and other flexibility-imparting agents. Also, organosilane compounds, organic titanate compounds, and organic aluminate compounds, and other coupling agents may be appropriately added. In particular, organosilanes as silane coupling agents, i.e., alkoxysilanes that have reactive functional groups, are effective for improving solder heat resistance and adhesiveness of the insulation material according to the present embodiment. Specific examples of alkoxysilanes include γ-aminopropyltrimethoxysilane, N-phenyl-γ-aminopropyltriethoxysilane, and other aminosilane compounds; γ-glycidoxypropyltrimethoxysilane, γ-glycidoxypropylmethyldiethoxysilane, and other epoxysilane compounds; γ-mercaptopropyltrimethoxysilane, and other mercaptosilane compounds; and γ-ureidopropyltriethoxysilane and other ureidosilane compounds.

Also, components used in rust-preventive agents capable of bonding with copper surfaces, i.e., triazole compounds, mercapto compounds other than mercaptosilane compounds, and imidazole copper complexes, may be added as adhesiveness improvers between the insulation material and the copper foil surface to the insulation material of the present embodiment. Examples of triazol compounds include 1,2,3-benzotriazole and tolyltriazole. Examples of mercapto compounds include 2,4,6-trimercapto-s-triazine, 2-di-n-butylamino-4,6-dimercapto-s-triazine, and 2-anilino-4,6-dimercapto-s-triazine. An example of an imidazole copper complex is 2-methylimidazole copper (2) complex. These components may be used alone or in a combination of two or more components.

Flame retardants may be added as required to the insulation material of the present embodiment. Examples of such flame retardants include halogen flame retardants, nitrogen flame retardants, phosphorus flame retardants, and inorganic flame retardants. Examples of halogen flame retardants include brominated-bisphenol A resins and epoxidated brominated-bisphenol A resins. Examples of an additive compounds that are nitrogen-based flame retardants include melamine and isocyanuric acid compounds. Examples of reactive compounds that are nitrogen-based flame retardants include phenol triazine curing agents and epoxy resins. Examples of phosphorus flame retardants include red phosphorus, phosphate compounds, and organic phosphorus compounds. Examples of inorganic flame retardants include the above-noted metal hydrates, zinc molybdate, zinc stannate, and compounds in which zinc molybdate or zinc stannate covers the surface of talc or silica. Also, when halogen flame retardants are used in combination with antimony oxide, very good flame resistance can be achieved.

The insulation material of the present embodiment may contain known substances other than those listed above as long as the reliability of the semiconductor device that uses the insulation material is not reduced. Examples of other substances that may be added include pigments, antioxidants, and organic solvents.

The semiconductor device 1 according to the present embodiment is wherein a semiconductor chip 9 is mounted on the topmost layer of a package board 2 by way of a plurality of solder bumps 7, wherein a wiring layer 16 composed of a resin that has a Young's modulus of 1 GPa or less in a temperature range of 10 to 30° C. is disposed on the topmost layer of the package board, as shown in FIG. 2. Constituent elements other than those described above are not shown in FIG. 2.

Next, a method for manufacturing the semiconductor device of the present embodiment is described with reference to FIG. 1. First, two support boards (not shown) composed of copper or another metal material are prepared, and the two support boards are laminated together. Next, an Ni (nickel) layer, an Au (gold) layer, an Ni layer, and a Cu (copper) layer are plated in the stated order to form a multilayered film on the two sides of the laminated support boards. The multilayered film is patterned by leaving only the portions in which the mounting pads 5 are to be formed, and removing the remainder. A semi-cured resin film is layered so as to embed the patterned multilayered film. The resin film is formed from an insulation material in which the elongation at break is 20% or higher and the Young's modulus in a temperature range of 10 to 30° C. is 1 GPa or less. The film is then heated and cured to form an insulation layer. Next, holes are formed in the insulation layer using laser or the like so as to reach the multilayered film. The interior of the holes is covered with a metal plating film to form vias 4. A first wiring layer in which a multilayered film and vias 5 are embedded in the insulation layer is thereby formed on the two surfaces of the two support boards.

Next, a wiring layer 3 is formed on the first wiring layer so as to be connected to the vias 4, and a semi-cured resin film is layered and heat cured so as to embed the wiring layer 3 to form an insulation layer. Vias 4 are formed so as to be connected to the wiring layer 3 in the insulation layer, and a second wiring layer in which the wiring layer 3 and the vias 4 in the insulation layer are embedded is formed. Next, the third layer and other wiring layers are sequentially formed using the same process as the second wiring layer. After all the wiring layers have been formed, the ultimately formed wiring layer is chemically plated or etched to form ball pads 6. A plurality of wiring layers is thereby layered on the two surfaces of the laminated support boards to form a package board 2.

Next, the two support boards are separated from each other. An alkaline solution is used to remove the support boards. An acidic solution is then used to remove the Ni layer of the multilayered film. The mounting pads 5 are thereby formed in which an Au layer, an Ni layer, and a Cu layer are formed in the stated order. A stiffener 11 is thereafter bonded to the surface of the side on which the mounting pads 5 are formed, by way of an adhesive layer 15 in the package board 2 to fabricate a "board having a stiffener."

Apart from the process for manufacturing the "board having a stiffener," solder bumps 7 are joined to the I/O pads (not shown) of the semiconductor chip 9 to fabricate a "chip having solder bumps." Next, the "chip having solder bumps" is connected to the "board having a stiffener" so that the solder bumps 7 of the "chip having solder bumps" are connected to the mounting pads 5 of the "board having a stiffener." An underfill resin 10 is subsequently filled, heated, and cured so as to embed the solder bumps 7 between the semiconductor chip 9 and the package board 2 and the vicinity thereof.

Next, a lid 12 is bonded by way of adhesives 13 and 14 to the upper surface of the stiffener 11 and semiconductor chip 9, i.e., the surface of the side opposite from the surface on which the package board 2 is bonded. BGA balls 8 are then bonded to the ball pads 6 formed on the lower surface of the package board 2 to thereby manufacture a semiconductor device 1.

When the supporting boards are removed, only the center portions are removed and the peripheral portions are left behind in the form of a frame. The remaining portion of the support boards may be used as the stiffener 11. The removal of the support boards and the formation of the stiffener 11 can thereby be performed simultaneously, and the adhesive layer 15 becomes unnecessary.

The operation of the embodiment configured in the manner described above is described next. The semiconductor device 1 is mounted on a motherboard (not shown) by way of BGA balls 8, as shown in FIGS. 1 and 2. The motherboard is, e.g., an FR-4 board or an FR-5 board, and is a glass epoxy board in which a glass cloth has been immersed in epoxy resin, for example.

A power source potential and signals are inputted to the semiconductor device 1 by way of the motherboard. In this case, the power source potential and signals are inputted to the semiconductor chip 9 by way of an electric current pathway composed of the following the sequence: BGA balls 8, ball pads 6, vias 4 and wiring layer 3, mounting pads 5, and solder bumps 7. The semiconductor chip 9 stores signals, performs calculations, and otherwise processes information on the basis of the inputted power source electric potential and signals, and outputs the results. The outputted signals are outputted to the motherboard by way of an electric current pathway composed of the following sequence: solder bumps 7, mounting pads 5, vias 4 and wiring layer 3, ball pads 6, and BGA balls 8; and is then outputted to the exterior by way of the motherboard.

At this point, operation of the semiconductor chip 9 causes heat to evolve. Some of the heat is absorbed by the lid 12, but the heat capacitance of the lid 12 is limited. Therefore, some of the heat is conducted to the package board 2 by way of the solder bumps 7, and the remainder of the heat accumulates in the semiconductor chip 9. As a result, the temperature of the semiconductor chip 9, solder bumps 7, and package board 2 unavoidably increases. Therefore, the semiconductor chip 9 and package board 2 thermally expand. Since the coefficient of thermal expansion of the silicon that forms the substrate of the semiconductor chip 9, and the coefficient of thermal expansion of the insulation material that primarily forms the package board 2 are mutually different, the amounts of thermal expansion are mutually different. As a result, a mutual shearing force is applied between the semiconductor chip 9 and package board 2 by way of the solder bumps 7.

In this case, in the present embodiment, the wiring layer 16, which is the topmost layer of the package board 2, is formed from an insulation material that has a relatively low Young's modulus of 1 GPa or less. Therefore, the wiring layer 16 can deform in accordance with the thermal expansion of the semiconductor chip 9. As a result, the force exerted between the semiconductor chip 9 and package board 2 is reduced, and a large force is not applied to the solder bumps 7. In a similar fashion, when the semiconductor device 1 is heated or cooled by changes in the ambient temperature, the heat stress exerted between the semiconductor chip 9 and package board 2 is reduced by the deformation of the wiring layer 16, and an excessively large force is not applied to the solder bumps 7. As a result, the semiconductor device 1 does not warp and the solder bumps 7 do not become fractured.

As described above, in the present embodiment, the topmost layer of the package board 2, i.e., the wiring layer 16 of the semiconductor chip 9 side is formed from a material that has a relatively low Young's modulus of 1 GPa or less when the temperature is 10 to 30° C. Therefore, an excessively large force is not applied to the solder bumps 7 even when a temperature cycle is applied to the semiconductor device 1 due to the operation of the semiconductor chip 9 or changes in the ambient temperature, and the solder bumps 7 can be prevented from becoming fractured. It is possible to prevent the solder bumps 7 from becoming fractured by the fatigue brought on by the repeated application of heat stress on the solder bumps 7. Accordingly, the semiconductor device 1 has high connection reliability in relation to temperature cycles. In contrast, the wiring layer is conventionally formed from a material that has a Young's modulus that is as high as possible, i.e., a hard material, so as to reduce deformations caused by heat stress. For this reason, the heat stress is concentrated in the solder bumps, and the solder bumps become fractured.

Since the elongation at break of the material that forms the wiring layer 16 is 20% or higher, cracks and other defects are not generated in the wiring layer 16 even when the wiring layer 16 deforms in accordance with the thermal expansion of the semiconductor chip 9, and the reliability of the semiconductor device 1 is high.

In the present embodiment, the insulation material that forms the wiring layer 16 contains crosslinked rubber that has a double bond and a polar group in the structure of the material. Therefore, electroless copper plating properties are good, and adhesiveness between the Cu layer and the wiring layer 16 is higher when the Cu layer is formed on the wiring layer 16 using an electroless plating method. The Young's modulus of the insulation material is stable and is kept at 1 GPa or less by adding the crosslinked rubber described above to the insulation material.

An example was shown in the embodiment described above in which only the wiring layer 16, which is the topmost layer of the package board 2, is formed from a resin that has a Young's modulus of 1 GPa or less at room temperature, but the present invention is not limited to this configuration, and the two or more wiring layers comprising the topmost layer may be formed from an insulation layer that contains the crosslinked rubber (E) and has a Young's modulus of 1 GPa or less, or all of the wiring layers of the package board 2 may be formed from this insulation material. The entire package board 2 can thereby deform, and the effect of reducing heat stress can be further enhanced.

In addition to the topmost layer of the package board 2, the wiring bottommost wiring layer of the package board 2, i.e., the wiring layer facing the motherboard (not shown) in the package board 2, is also preferably formed from the insulation material described above. The bottommost wiring layer of the package board 2 can thereby deform in accordance with the thermal expansion of the motherboard, and the thermal stress applied to the BGA balls 8 can be reduced. As a result, warping of the semiconductor device 1 and fatigue fracturing of the BGA balls 8 can be prevented and the connection reliability in relation to temperature cycles can be improved. The amount of elongation at break of the insulation material that forms the bottommost wiring layer of the package board 2 described above is preferably 50% or higher.

Ball pads 6 and BGA balls 8 may be disposed on the surface of the side on which the semiconductor chip 9 are mounted of the package board 2, and the BGA balls 8 may be connected to the motherboard. A solder paste may be disposed instead of solder bumps 7.

EXAMPLES

The effects of the embodiments of the present invention are described in detail below by making a comparison with comparative examples that do not fall within the scope of the claims. In the present example, the insulation material described in the embodiment above was actually fabricated; a laminate film, a single-sided copper laminate sheet, an FCBGA semiconductor device, and other sample materials were fabricated using the resin material; and the results were evaluated. Described first are the components that form the resin material of the examples and comparative examples. TABLE 1 shows each of these components, i.e., the reactive elastomers (A), the epoxy resin (B), and the epoxy resin curing agent (C). The resin (D) in which the distance between the functional groups is greater than that of phenol novolac resin is one type of the epoxy resin curing agent (C). TABLE 2 shows the additives (E) that are added to the resin materials.

TABLE 1

| Component | | Type | | Molecular weight (Mw) | Hydroxyl group equivalent (g/eq) | Epoxy equivalent (g/eq) |
|---|---|---|---|---|---|---|
| Symbol | Substance | Symbol | Substance | | | |
| A | Reactive elastomer | A1 | Polyamide elastomer without CN | 20,000 | 5,000 | — |
| | | A2 | Polyamide elastomer without CN | 20,000 | 2,500 | — |
| | | A3 | Flexible epoxy resin | — | — | 1,070 |
| | | A4 | Flexible epoxy resin | — | — | 1,800 |
| | | A5 | Polyamide elastomer without CN | 50,000 | 5,000 | — |
| | | A6 | Polyamide elastomer without CN | 100,000 | 5,000 | — |
| | | A7 | Polyamide elastomer without CN | 150,000 | 5,000 | — |
| | | A8 | Polyamide elastomer without CN | 200,000 | 5,000 | — |
| B | Epoxy resin | B1 | Phenol biphenylene aralkyl epoxy resin | 1,780 | — | 274 |

TABLE 1-continued

| Component | | Type | | Molecular weight | Hydroxyl group equivalent | Epoxy equivalent |
|---|---|---|---|---|---|---|
| Symbol | Substance | Symbol | Substance | (Mw) | (g/eq) | (g/eq) |
| | | B2 | Cresol novolac epoxy resin | 600(solid) | — | 190 |
| C | Epoxy resin curing agent | C1 | p-Cresol novolac resin | 1,200 | 118 | — |
| | | C2 | Phenol novolac resin | 500(solid) | 100 | — |
| D | | D1 | Phenol xylene resin | 1,100 | 169 | — |

Among the reactive elastomers (A) shown in TABLE 1, the flexible epoxy resin (A3) is Epofriend AT501 (registered trade name) manufactured by Daicel Chemical Industries, and the styrene percentage content is 40 mass %. The flexible epoxy resin (A4) is Epofriend AT504 (registered trade name) manufactured by Daicel Chemical Industries, and the styrene percentage content is 70 mass %.

TABLE 2

| Component | | Type | |
|---|---|---|---|
| Symbol | Substance | Symbol | Substance |
| E | Additive | E1 | Crosslinked styrene-butadiene rubber having a double bond and a polar group |
| | | E2 | Epoxy-containing polybutadiene rubber |
| | | E3 | End-epoxidated polybutadiene |
| | | E4 | Core-shell acrylic rubber particles |
| | | E5 | Calcium carbonate |

Among the additives (E) shown in TABLE 2, the styrene-butadiene rubber (E1) is a crosslinked styrene-butadiene rubber having an OH group, a COOH group, or other polar functional groups. Specifically, the rubber may be XSK-500 (registered trade name) manufactured by JSR, and an L711ST/MEK solution can be used. The solid concentration is 20 mass %, and the viscosity is 460 mPas. The epoxy-containing polybutadiene rubber (E2) is Epolead PB3600 (registered trade name) manufactured by Daicel Chemical Industries, has a molecular weight of 5,900, and has an epoxy equivalent of 200 g/eq. The end-epoxidated polybutadiene rubber (E3) is Denarex R-45EPT (registered trade name) manufactured by Nagase Chemtex, and the epoxy equivalent is 1,570 g/eq. The core-shell acrylic rubber particles (E4) is Metablen KW-4426 (registered trade name) manufactured by Mitsubishi Rayon. The calcium carbonate (E5) is Caltex 5 (registered trade name) manufactured by Maruo Calcium.

(1) Method for Preparing a Varnish Solution

A number of components were selected from among the components described above, as shown in TABLES 4 to 6, and were dissolved and dispersed in an organic solution together with a curing acceleration catalyst. TABLE 3 shows the curing acceleration catalyst and organic solutions used in this case. For example, No. 2 (an example) shown in TABLE 4 was prepared as a mixture by adding 0.05 mass % of the imidazole catalyst shown in TABLE 3 as the curing acceleration catalyst to a resin material containing 67.5 mass % of a polyamide elastomer which does not contain a cyanate (CN) group (A1) as the reactive elastomer (A), 16.84 mass % of a phenol biphenylene aralkyl epoxy resin (B1) as the epoxy resin (B), 5.66 mass % of a p-cresol novolac resin (C1) as the epoxy resin curing agent (C), and 10 mass % of a styrene-butadiene rubber (E1) as the additive (E), wherein the mass ((A)+(B)+(C)+(E)) of the resin material was 100 mass %. This mixture was dissolved and dispersed in an organic solvent (N,N-dimethylformamide: DMF) to prepare a varnish solution in which the total amount of the non-volatile components, i.e., the components other than the organic solvent, was 30 mass %.

In TABLES 4 to 6, the numerical values noted in the rows corresponding to the components indicate the mass ratios of the components in the resin component. For example, in No. 2 (an example) shown in TABLE 4, the mass ratio of the reactive elastomer A1 in relation to the entire resin component, i.e., the value of (A1×100)/(A+B+C+E), is 67.50%, wherein the A1 mass % is the content of the reactive elastomer A1. Also, A=A1+A2+A3+A4, B=B1, C=C1+D1, and E=E1+E2+E3+E4+E5. The abbreviation "phr" refers to "per hundred resin" and expresses the mass ratio (mass %) of the curing acceleration catalyst when the mass of the resin is 100.

TABLE 3

| Material | Type |
|---|---|
| Curing acceleration catalyst | Imidazole catalyst "1B2PZ" manufactured by Shikoku Chemicals Corp. |
| Additive | Cyclopentanone manufactured by Zeon Corp. N-dimethylformamide manufactured by Kanto Chemical Co. |

TABLE 4

| | 1 Comparative example | 2 Example | 3 Example | 4 Example | 5 Example |
|---|---|---|---|---|---|
| Reactive elastomer A1 | 75.00 | 67.50 | — | 71.25 | 60.00 |
| Reactive elastomer A2 | — | — | 67.50 | — | — |
| Reactive elastomer A3 | — | — | — | — | — |
| Reactive elastomer A4 | — | — | — | — | — |
| Epoxy resin B1 | 18.71 | 16.84 | 16.84 | 17.78 | 14.97 |
| Epoxy resin curing agent C1 | 6.29 | 5.66 | 5.66 | 5.97 | 5.03 |
| Epoxy resin curing agent D1 | — | — | — | — | — |
| Inorganic filler | — | — | — | — | — |
| Curing acceleration catalyst (phr) | 0.05 | 0.05 | 0.05 | 0.05 | 0.05 |
| Additive E1 | — | 10 | 10 | 5 | 20 |
| Additive E2 | — | — | — | — | — |
| Additive E3 | — | — | — | — | — |
| Additive E4 | — | — | — | — | — |
| Additive E5 | — | — | — | — | — |
| Electroless Cu plating properties | X | ◎ | ◎ | ◎ | ◎ |
| Toughness — Elongation at break (%) | 50 | 33 | 55 | 36 | 30 |
| Toughness — Young's modulus (GPa) | 0.64 | 0.39 | 0.50 | 0.62 | 0.35 |
| Circuit embedding properties | ◎ | ◎ | ◎ | ◎ | ◎ |
| Connection reliability | 0/38 | 0/38 | 0/38 | 0/38 | 0/38 |
| Insulation reliability (hours) | Over 500 | Over 500 | Over 500 | Over 500 | Over 500 |

TABLE 5

| | 6 Comparative example | 7 Example | 8 Comparative example | 9 Example |
|---|---|---|---|---|
| Reactive elastomer A1 | — | — | — | — |
| Reactive elastomer A2 | — | — | — | — |
| Reactive elastomer A3 | 39.00 | 32.50 | 12.87 | 12.87 |
| Reactive elastomer A4 | — | — | 26.13 | 26.13 |
| Epoxy resin B1 | 14.00 | 11.67 | 14.00 | 14.00 |
| Epoxy resin curing agent C1 | — | — | — | — |
| Epoxy resin curing agent D1 | 7.00 | 5.83 | 7.00 | 7.00 |
| Inorganic filler | 40 | 40 | 40 | 40 |
| Curing acceleration catalyst (phr) | 0.05 | 0.05 | 0.05 | 0.05 |
| Additive E1 | — | 10 | — | 10 |
| Additive E2 | — | — | — | — |
| Additive E3 | — | — | — | — |
| Additive E4 | — | — | — | — |
| Additive E5 | — | — | — | — |
| Electroless Cu plating properties | X | ○ | X | ○ |
| Toughness — Elongation at break (%) | 120 | 84 | 70 | 52 |
| Toughness — Young's modulus (GPa) | 0.30 | 0.40 | 0.27 | 0.60 |
| Circuit embedding properties | ◎ | ◎ | ◎ | ◎ |
| Connection reliability | 0/38 | 0/38 | 0/38 | 0/38 |
| Insulation reliability (hours) | Over 500 | Over 500 | Over 500 | Over 500 |

TABLE 6

| | 2 Example | 10 Comparative example | 11 Comparative example | 12 Comparative example | 13 Comparative example |
|---|---|---|---|---|---|
| Reactive elastomer A1 | 67.50 | 67.50 | 67.50 | 67.50 | 67.50 |
| Reactive elastomer A2 | — | — | — | — | — |
| Reactive elastomer A3 | — | — | — | — | — |
| Reactive elastomer A4 | — | — | — | — | — |
| Epoxy resin B1 | 16.84 | 16.84 | 16.84 | 16.84 | 16.84 |
| Epoxy resin curing agent C1 | 5.66 | 5.66 | 5.66 | 5.66 | 5.66 |
| Epoxy resin curing agent D1 | — | — | — | — | — |
| Inorganic filler | — | — | — | — | — |
| Curing acceleration catalyst (phr) | 0.05 | 0.05 | 0.05 | 0.05 | 0.05 |
| Additive E1 | 10 | — | — | — | — |
| Additive E2 | — | 10 | — | — | — |
| Additive E3 | — | — | 10 | — | — |
| Additive E4 | — | — | — | 10 | — |
| Additive E5 | — | — | — | — | 10 |
| Electroless Cu plating properties | ◎ | X | X | X | X |
| Toughness Elongation at break (%) | 33 | 32 | 36 | 41 | 20 |
| Young's modulus (GPa) | 0.39 | 0.67 | 0.49 | 0.80 | 0.88 |
| Circuit embedding properties | ◎ | ◎ | ◎ | ◎ | ◎ |
| Connection reliability | 0/38 | 0/38 | 0/38 | 0/38 | 0/38 |
| Insulation reliability (hours) | Over 500 | Over 500 | Over 500 | Over 500 | Over 500 |

(2) Fabrication of Laminate Film

The above-described varnish solution was uniformly coated onto a polyethylene terephthalate (PET) film on which a release agent had been coated, using a coating machine so as to obtain a target thickness. The film was thereafter dried for 5 minutes at a temperature of 100° C. to volatilize the solution at a constant rate. The resin surface was covered using a PET film having a release agent and a three-layer laminate film; i.e., a laminate film having the configuration "release PET layer/resin layer/release PET layer" was fabricated. The resin layer (including the remaining solution) in the laminate film was in an uncured state.

(3) Evaluation of the Electroless Copper Plating Properties

The above-described laminate film was layered onto the copper foil of the two sided copper-layered plate in which copper foil had been layered on both sides of the resin board, and the film was then cured. The curing was carried out for 30 minutes under a pressure of 1.5 MPa at a temperature of 120° C., and thereafter carried out for 120 minutes under a pressure of 3 MPa at a temperature of 180° C. A board having a laminate film was thereby fabricated. The laminate film was subsequently desmeared. The desmear treatment was carried out by using the dip method in which a series of steps was performed three times, i.e., the board was immersed for 1 minute in a desmearing solution, neutralized, and then washed. This method is generally carried out by board manufacturers, although the treatment times may vary slightly.

Next, the board was subjected to electroless copper plating to form a copper-plated layer on the laminate film. The adhesiveness of the copper-plated layer was evaluated by observing the external appearance and employing a simple peeling test using tape. Cases in which the adhesiveness of the copped-plated layer was excellent were marked with "◎," cases in which the adhesiveness was sufficient for practical purposes were marked with "○," and cases in which adhesiveness was poor were marked with "X." The evaluation results are shown in TABLES 4 to 6.

(4) Toughness Evaluation

The laminate film was placed under a pressure of 3 MPa for one hour at a temperature of 160° C., held for two hours without the application of pressure at a temperature of 180° C., and then press molded to fabricate a cured film having a thickness of 50 μm for tensile testing. The cured film was then cut into strips having a width of 10 mm and a length of 80 mm, and the tensile test was performed. The conditions of the tensile test were set to be a distance of 60 mm between supports that support the cured film and an elastic stress velocity of 5 mm/minute. The tensile test was used to calculate the elongation at break and Young's modulus.

(5) Evaluation of Circuit Embedding Properties

A release PET on one side was peeled away from the laminate film (release PET layer/resin layer/release PET layer), and the resin layer was exposed. A conventional three-layer CCL, i.e., a conventional three-layer CCL having a three-layer structure composed of "PEN layer/resin layer (ABF-GX (registered trade name) manufactured by Ajinomoto Fine-Techno)/copper foil," was prepared, and a line-and-space pattern simulating a copper wiring circuit was formed on the surface of the copper foil. The widths of the lines and spaces in the pattern were 100 µm. The three-layer CCL copper foil surface was superimposed on the resin layer of the laminate film, and a mirror wafer was mounted on the three-layer CCL.

Samples were thereby fabricated having the following layers in the following order: release PET layer/resin layer (resin layer of example or comparative example)/copper foil-conventional resin layer-PEN layer-mirror wafer). The samples were subjected to a pressure of 1 MPa for 30 minutes at a temperature of 180° C., and the resin layer of the laminate film and the patterned copper foil were made to bond. Next, the samples were observed using a microscope, the extent to which the patterns in the copper foil were embedded in the resin layer was observed, and the quality of the circuit embedding properties was evaluated. Cases in which the circuit embedding properties were excellent were marked with "⊙", cases in which the circuit embedding properties have no practical problem were marked with "◯" and cases in which the circuit embedding properties have some practical problem were marked with "Δ". The evaluation results are shown in TABLES 4 to 8.

TABLE 7

| | | 14 Example | 15 Comparative example | 16 Example | 17 Example | 18 Example | 19 Example |
|---|---|---|---|---|---|---|---|
| Reactive elastomer A1 | | — | — | — | — | — | — |
| Reactive elastomer A5 | | — | — | — | — | 37 | — |
| Reactive elastomer A6 | | 60 | 60 | 15 | 37 | — | — |
| Reactive elastomer A7 | | — | — | — | — | — | 37 |
| Reactive elastomer A8 | | — | — | — | — | — | — |
| Epoxy resin B1 | | 14.97 | — | — | — | — | — |
| Epoxy resin B2 | | — | 13 | 43 | 28 | 28 | 28 |
| Epoxy resin curing agent C1 | | 5.03 | — | — | — | — | — |
| Epoxy resin curing agent C2 | | — | 7 | 22 | 15 | 15 | 15 |
| Additive E1 | | 20 | 20 | 20 | 20 | 20 | 20 |
| Curing acceleration catalyst (phr) | | 0.05 | 0.05 | 0.05 | 0.05 | 0.05 | 0.05 |
| Electroless Cu plating properties | | ⊙ | ⊙ | ⊙ | ⊙ | ⊙ | ⊙ |
| Toughness | Elongation at break (%) | 55 | 50 | 21 | 38 | 30 | 42 |
| | Young's modulus (GPa) | 0.70 | 0.75 | 1.00 | 0.85 | 0.65 | 0.90 |
| Circuit embedding properties 180° C., 30 min. | | ◯ | ◯ | ⊙ | ⊙ | ⊙ | ◯ |
| Connection reliability | | 0/38 | 0/38 | 0/38 | 0/38 | 0/38 | 0/38 |
| Insulation reliability (hours) | | Over 500 | Over 500 | Over 500 | Over 500 | Over 500 | Over 500 |

TABLE 8

| | 20 Example | 21 Comparative example | 22 Example | 23 Example | 24 Comparative example |
|---|---|---|---|---|---|
| Reactive elastomer A1 | — | — | — | — | — |
| Reactive elastomer A5 | — | — | — | — | — |
| Reactive | — | 5 | 60 | 75 | 85 |

TABLE 8-continued

| | | 20 Example | 21 Comparative example | 22 Example | 23 Example | 24 Comparative example |
|---|---|---|---|---|---|---|
| elastomer A6 Reactive elastomer A7 | | — | — | — | — | — |
| Reactive elastomer A8 | | 37 | — | — | — | — |
| Epoxy resin B1 | | — | — | — | — | — |
| Epoxy resin B2 | | 28 | 59 | 23 | 13 | 7 |
| Epoxy resin curing agent C1 | | — | — | — | — | — |
| Epoxy resin curing agent C2 | | 15 | 31 | 12 | 7 | 3 |
| Additive E1 | | 20 | 5 | 5 | 5 | 5 |
| Curing acceleration catalyst (phr) | | 0.05 | 0.05 | 0.05 | 0.05 | 0.05 |
| Electroless Cu plating properties | | ⊚ | ⊚ | ⊚ | ⊚ | X |
| Toughness | Elongation at break (%) | 45 | 12 | 40 | 60 | 70 |
| | Young's modulus (GPa) | 0.92 | 2.10 | 1.00 | 0.80 | 0.70 |
| Circuit embedding properties 180° C., 30 min. | | ○ | ⊚ | ○ | ○ | Δ |
| Connection reliability | | 0/38 | 10/38 | 0/38 | 0/38 | 2/38 |
| Insulation reliability (hours) | | Over 500 | Over 500 | Over 500 | Over 500 | Over 500 |

(6) Fabrication of a Single-Sided Copper-Plated Prepreg Material

The varnish solution was uniformly coated onto the roughened surface (also referred to a matted surface) of the copper foil using a coating machine so as to obtain a target thickness. The film was thereafter dried for 5 minutes at a temperature of 100° C. to volatilize the solution at a constant rate. The resin surface was covered using a PET film having a release agent, and a single-sided copper-plated prepreg material having a three-layer structure (release PET layer/resin portion/copper foil) was fabricated. The resin layer (also including the remaining solution) in the prepreg material was in an uncured state.

(7) Fabrication of an FCBGA Semiconductor Device

Wiring was formed on the copper foil of the single-sided copper-plated prepreg material described above. A plurality of layers of the single-sided copper-plated prepreg material was layered using the build-up method to fabricate a package board. A semiconductor chip was mounted on the package board, a frame-shaped stiffener was provided about the periphery of the semiconductor chip, and a lid (heat sink) was bonded to the semiconductor chip and reinforcing plate. The FCBGA semiconductor device shown in FIG. 1 was fabricated thereby.

(8) Evaluation of Connection Reliability

Thirty-eight FCBGA semiconductor devices were prepared for the each of the resin materials, and the semiconductor devices were subjected to a temperature cycle test. The temperature cycle test was started from room temperature, hand the temperature was reduced to −40° C. and held at −40° C. for 15 minutes. The temperature was then increased to 125° C. and held at 125° C. for 15 minutes to complete a single cycle. The heating and cooling times were constant at 15 minutes. Cases in which cracks were generated in the connection parts (solder bumps) between the semiconductor chip and package board comprising the FCBGA semiconductor device were determined to be defective cases when the temperature cycle test was carried out for 1,000 cycles. The number of cases in which defects occurred (defect generation count) was used as an index of the connection reliability. In other words, the connection reliability was determined to be more excellent for FCBGA semiconductor devices that have a fewer number of defects. The evaluation results are shown in TABLES 4 to 8. The entries in the row titled "Connection reliability" in TABLES 4 to 8 were obtained by carrying out the temperature cycle test described above, and the entries indicate the number of semiconductor devices among the thirty-eight FCBGA semiconductor devices that produced defects in each sample.

(9) Evaluation of Insulation Reliability

Figure 3:
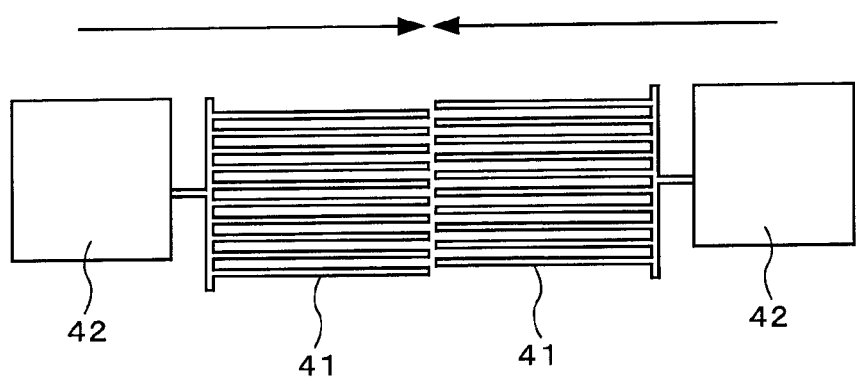
FIG. 3 is a diagram showing a schematic of the evaluation board fabricated in the test example of the present invention.
Figure 4:
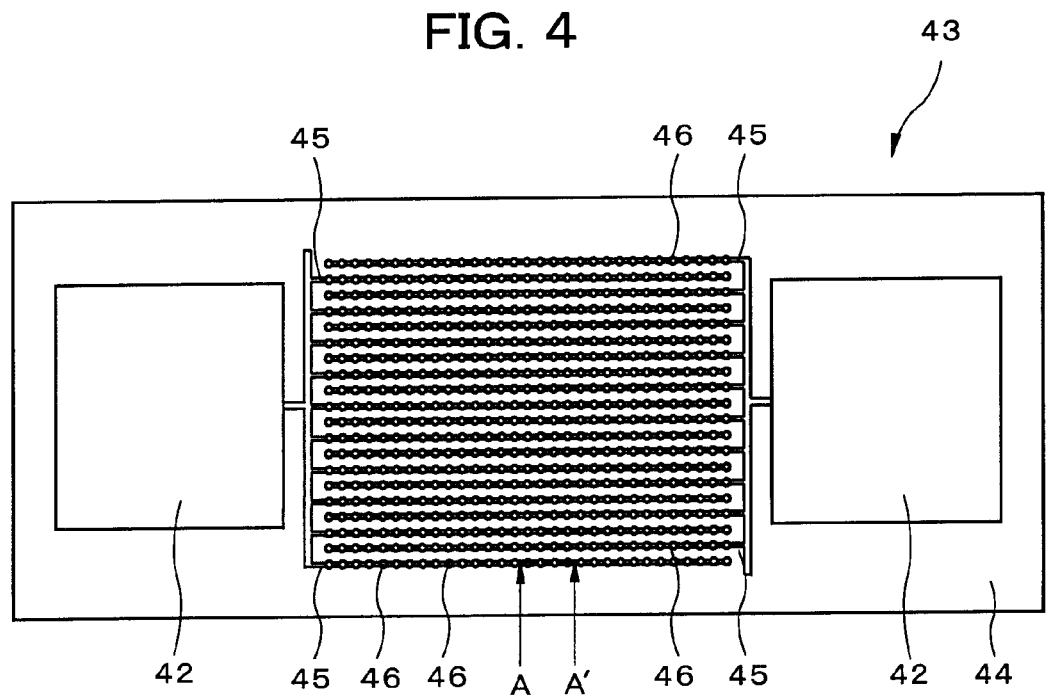
FIG. 4 is a top view showing the specifics of the evaluation board.
Figure 5:
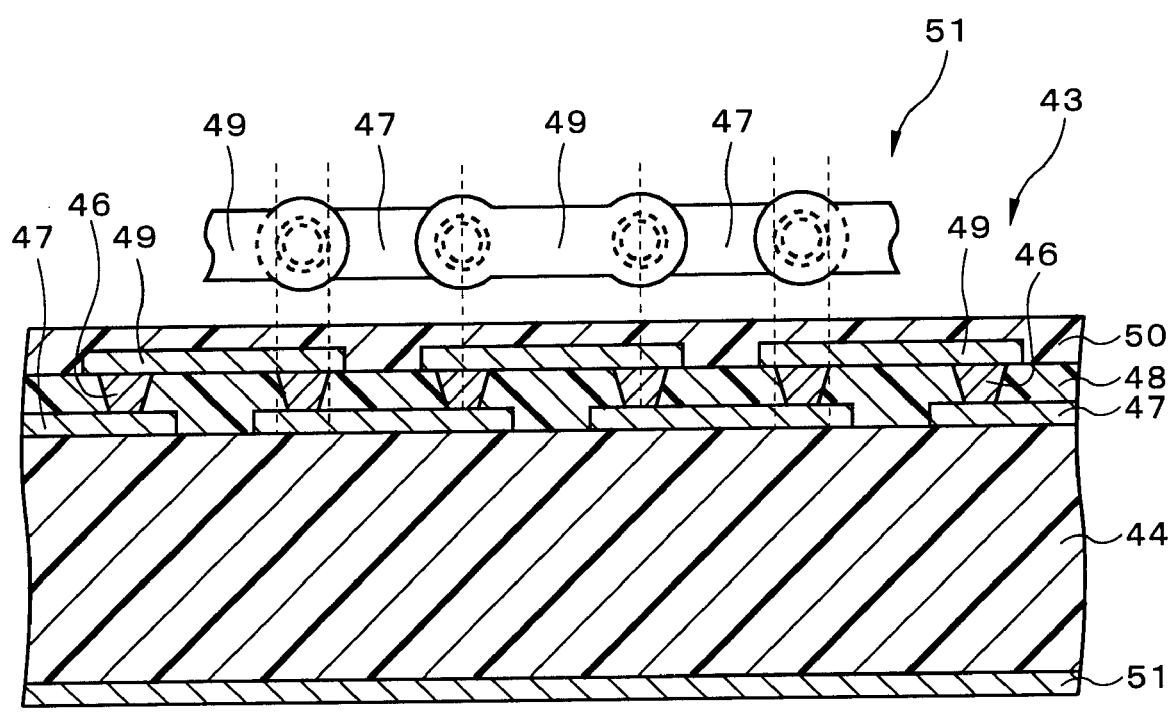
FIG. 5 is a partial enlarged cross-sectional view of the evaluation board.

A board for evaluating insulation reliability was fabricated using the varnish solution described above. FIG. 3 is a diagram showing a schematic of the evaluation board. FIG. 4 is a top view showing the specifics of the evaluation board. FIG. 5 is a partial enlarged cross-sectional view of the evaluation board. Also shown in FIG. 5 is the flat shape of the wiring 45. The board for evaluation had two pectinate wirings 41 disposed so as to be inter-nested, as shown in FIG. 3. Specifically, the two pectinate wirings 41 were disposed so that the teeth of one pectinate wiring 41 were positioned between the teeth of the other pectinate wiring 41, and the pectinate wirings did not make contact with each other. The pectinate wirings were connected to square electrodes 42.

A FR-4 board 44 as a core was disposed on the evaluation board 43, as shown in FIG. 4. The external dimensions of the board 44 were 24.4 mm in the lengthwise direction, 8.0 mm in the crosswise direction, and a thickness of 0.8 mm. Two electrodes 42 were disposed on the surface of the board 44 at a distance from each other in the lengthwise direction of the board 44. As viewed from above, the length of one side of the electrode 42 was 5.2 mm. The two pectinate wirings 41 were disposed so as to be interested in the area between the electrodes 42. Wiring 45 having 10 wires as the teeth was disposed in each of the pectinate wirings 41. The length of each wiring 45 was 8.7 mm. Thirty vias 46 were formed in each of the wires 45. Specifically, the total number of vias disposed in the evaluation board 43 was 2×10×30=600. These 600 vias 46 were arrayed in the form of a matrix (20×30). The array pitch of the vias was 300 μm in both directions.

A Cu pattern 47 composed of Cu was intermittently disposed on the surface of the board 44 along the direction in which the wiring 45 extended, as shown in FIG. 5. A build-up resin layer 48 having a thickness of 50 μm was disposed so as to cover the Cu pattern 47. The build-up resin layer 48 was formed from any of the resins shown in TABLES 1 to 3. A Cu pattern 49 composed of CI was intermittently disposed on the surface of the build-up resin layer 48 along the direction in which the wiring 45 extended. The Cu patterns 47 and 49, as viewed from above, had two 150-μm diameter circular portions and a single rectangular portion connecting the circular portions. The thickness of the rectangular portion was 18 μm. The rectangular portions of the Cu pattern 49 were positioned directly above the areas between the Cu patterns 47, and the circular portions of the Cu patterns 49 were positioned directly above the circular portions of the Cu pattern 47.

One via 46 was disposed between each of the circular portions of the Cu pattern 47 and the circular portions of the Cu pattern 49 in the build-up resin layer 48, and the vias 46 connected the Cu pattern 47 and Cu pattern 49 to each other. The shape of the vias 46 was a conic trapezoid, the diameter of the upper portion was 100 μm, and the diameter of the lower portion was 75 μm. The distance between two vias connected to the same Cu pattern 47 and Cu pattern 49 was 300 μm, as described above. A solder resist 50 having a thickness of 35 μm was disposed on the build-up resin layer 48 so as to cover the Cu pattern 49. A Cu pattern 51 having a thickness of 18 μm was disposed on the entire surface of the reverse surface of the board 44. For the sake of convenience, the build-up resin layer 48 and solder resist 50 are not depicted in FIG. 4.

A HAST (Highly Accelerated temperature humidity Stress Test) was performed using the evaluation board 43 fabricated in the manner described above. The test conditions were a temperature of 130° C., a humidity of 85 RH %, and a voltage of 5 V applied between the electrodes. The time required for the resistance between the electrodes 42 to decrease to $1\times10^9 \Omega$ or less was measured and used as an index of the insulation reliability. The longer this time was measured to be, the better the insulation reliability was. The test was carried out for a maximum of 500 hours. The test results are shown in TABLES 4 to 8. The entry "over 500 hours" in TABLES 4 to 8 indicates that the resistance between the electrodes did not decrease to $1\times10^9 \Omega$ or less, even when the test was continued for 500 hours.

(10) Evaluation Results

Nos. 2 to 5, No. 7, No. 9, No. 14 to 20, No. 22 and No. 23 shown in TABLES 4 to 8 are examples of the present invention. In these examples, a crosslinked styrene-butadiene rubber (E1) having a double bond and a polar group had been added as the additive (E) used with the insulation material, and the content of the Reactive elastomer (A) is 15 to 80 mass %, and the adhesiveness of the copper-plating layer formed using electroless plating on the laminate film was therefore high. In other words, the electroless copper plating properties were good. In contrast, Nos. 1, 6, 8, 10 to 13, 21 and 24 shown in TABLES 4 to 6 and 8 are comparative examples. In these comparative examples Nos. 1, 6, 8, 10 to 13, a crosslinked styrene-butadiene rubber (E1) having a double bond and a polar group in the insulation material was not added, and the electroless copper plating properties were therefore poor. Also, in the comparative example No. 21, the content of the Reactive elastomer (A) is less than 15 mass %, the elongation of the insulation material is therefore insufficient. In the comparative example No. 21, the Young's modulus is over 1 GPa and the connection reliability is therefore degraded in comparison to the examples. Furthermore, in the comparative example No. 24, the content of the Reactive elastomer (A) is over 80 mass %, the hardening of the insulation material is insufficient and therefore the chemical resistance of the insulation material was reduced and also electroless plating property was degraded. The toughness, circuit embedding properties, connection reliability, and insulation reliability was good for both the examples and comparative examples described above except the Nos. 21 and 24.

INDUSTRIAL APPLICABILITY

The present invention can be advantageously used in FCBGA, WLCP, and other semiconductor devices in which a semiconductor chip is mounted on a wiring board by way of solder bumps.

The invention claimed is:

1. An insulation material having a Young's modulus of 1 GPa or less in a temperature range of 10 to 30° C., comprising:
 (A) a reactive elastomer that reacts with epoxy resin or an epoxy resin curing agent and comprises a polyamide elastomer containing a phenolic hydroxyl group as represented by one of the following formulae that does not contain a cyanate group in the structure thereof,

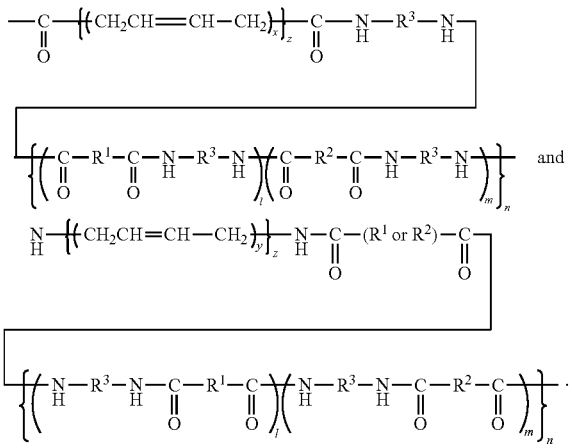

wherein $R^1$ is a bivalent aromatic compound with a carbon number of from 6 to 12 having a phenolic hydroxyl group, $R^2$ is a bivalent aromatic compound having a carbon number of from 6 to 12 that does not contain a phenolic hydroxyl group, or a bivalent aromatic compound having a carbon number of from 1 to 10, and $R^3$ is a bivalent aromatic compound having a carbon number of from 6 to 12, or a bivalent aromatic compound having a carbon number of from 1 to 10, x and y are each independently an integer from 3 to 7, z is an integer from 5 to 15, n=1+m, n is an integer from 2 to 200, and 1 and m satisfy the relationship $m/(1+m) \geqq 0.04$;

(B) an epoxy resin;

(C) an epoxy resin curing agent; and (D) a crosslinked rubber having a double bond and a polar group in the structure thereof and comprising a crosslinked styrene-butadiene rubber having a hydroxyl group or a carboxyl group as the polar group.

2. The insulation material according to claim 1, wherein the value of $(E \times 100)/(A+B+C+E)$ is 3 to 25%, wherein A mass % is the content of said reactive elastomer, B mass % is the content of said epoxy resin, C mass % is the content of said epoxy resin curing agent, and E mass % is the content of said crosslinked rubber.

3. The insulation material according to claim 2, wherein said value of $(E \times 100)/(A+B+C+E)$ is 5 to 20%.

4. The insulation material according to claim 1, wherein the value of $(A \times 100)/(A+B+C+E)$ is 15 to 80 mass %, wherein A mass % is the content of said reactive elastomer, B mass % is the content of said epoxy resin, C mass % is the content of said epoxy resin curing agent, and E mass % is the content of said crosslinked rubber.

5. The insulation material according to claim 4, wherein the value of $(A \times 100)/(A+B+C+E)$ is 50 to 75 mass %.

6. The insulation material according to claim 1, wherein the value of $(B \times 100)/(A+B+C+E)$ is 20% or less, wherein A mass % is the content of said reactive elastomer, B mass % is the content of said epoxy resin, C mass % is the content of said epoxy resin curing agent, and E mass % is the content of said crosslinked rubber.

7. A wiring board using the insulation material according to claim 1.

8. A semiconductor device being provided with the wiring board according to claim 7.

* * * * *

UNITED STATES PATENT AND TRADEMARK OFFICE
CERTIFICATE OF CORRECTION

PATENT NO. : 7,981,963 B2  
APPLICATION NO. : 11/733689  
DATED : July 19, 2011  
INVENTOR(S) : Yukihiro Kiuchi et al.

Page 1 of 1

It is certified that error appears in the above-identified patent and that said Letters Patent is hereby corrected as shown below:

In the Specifications:

Column 1, Line 57: After "2002-198462" insert -- . --

Column 6, Lines 14-15: Delete "3-hydroxyhthalic" and insert -- 3-hydroxyphthalic --, therefor Column 9, Line 16: Delete "$R^{4}$" and insert -- $R^{4'}$ --, therefor Column 12, Line 26: Delete "triazol" and insert -- triazole --, therefor Column 13, Line 57: Delete "bonded" and insert -- bounded --, therefor Column 25, Line 66: Delete "hand" and insert -- and --, therefor Column 27, Line 9: Delete "interested" and insert -- inter-nested --, therefor In the Claims:

Column 28, Line 56-59:

In Claim 1, delete " 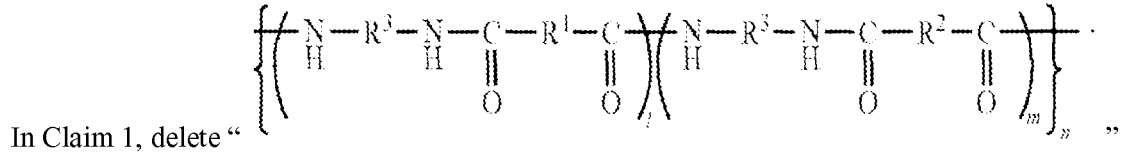 "

and insert --  --, therefor

Signed and Sealed this  
Eighteenth Day of June, 2013

Teresa Stanek Rea  
*Acting Director of the United States Patent and Trademark Office*